United States Patent [19]
Hunninghaus et al.

[11] Patent Number: 5,708,566
[45] Date of Patent: Jan. 13, 1998

[54] SOLDER BONDED ELECTRONIC MODULE

[75] Inventors: Roy E. Hunninghaus, Des Plaines, Ill.; Kevin M. Andrews, Kenosha, Wis.; Gary L. Christopher, Fox River Grove, Ill.; David J. Anderson, Oak Lawn, Ill.; Joseph P. Tomase, Libertyville, Ill.

[73] Assignee: Motorola, Inc., Schaumburg, Ill.

[21] Appl. No.: 742,110

[22] Filed: Oct. 31, 1996

[51] Int. Cl.[6] .................................................. H05K 7/20
[52] U.S. Cl. ........................ 361/764; 174/252; 364/715; 364/719; 364/720
[58] Field of Search ........................... 174/252; 361/704, 361/707, 712–713, 715, 719–720

[56] References Cited

U.S. PATENT DOCUMENTS

| | | | |
|---|---|---|---|
| 5,262,922 | 11/1993 | Yamaii et al. | 361/720 |
| 5,352,926 | 10/1994 | Andrews . | |
| 5,353,192 | 10/1994 | Nordin | 361/720 |
| 5,410,449 | 4/1995 | Brunner . | |
| 5,467,251 | 11/1995 | Katchmar | 361/719 |
| 5,646,826 | 7/1997 | Katchmar | 361/704 |

*Primary Examiner*—Gregory D. Thompson
*Attorney, Agent, or Firm*—Jasper W. Dockrey

[57] ABSTRACT

An electronic control module (10) includes a circuit substrate (12) containing a plurality of thermal vias (36) and a heat-generating electronic device (26) attached to the thermal vias (36). The circuit substrate (12) is attached to a mounting plate (18) by a plurality of electrically-isolated, thermal attachment pads (20) located at selected positions on an electrically insulating layer (16) overlying a metal baseplate (14). A solder layer (22) functions to both mechanically attach the plurality of thermal vias (36) to the plurality of thermal attachment pads (20), and to provide a thermal dissipation pathway for heat generated by the electronic devices (26). The heat is transferred from the circuit substrate (12) through the plurality of thermal attachment pads (20) to the metal baseplate (14).

11 Claims, 2 Drawing Sheets

SOLDER BONDED ELECTRONIC MODULE

FIELD OF THE INVENTION

This invention relates, in general, to electronic modules containing electronic devices capable of generating large quantities of heat, and more particularly, to methods for mounting printed circuit boards populated by heat-generating electronic components to heat dissipation surfaces.

BACKGROUND OF THE INVENTION

Electronic modules used in automotive applications often employ electronic components mounted to a printed circuit board. The electronic components are typically soldered to the printed circuit boards and electrically coupled to metal traces overlying the surface of the printed circuit board. Typically, for automotive control applications, several large power transistors are mounted to the printed circuit board. To reduce product cost, it is desirable to utilize standard packaged devices, such as the TO-220 device, in electronic modules intended for automotive control applications. For example, in automotive applications, such as ignition control systems, the TO-220 power transistors are typically used as ignition coil drivers. The TO-220 devices are capable of generating large quantities of heat during normal operation. To keep the temperature of the power transistors from rising to a destructive level, heat dissipating structures are generally employed to conduct the heat away from the transistors. In one method, a heat sink is secured to the opposite surface of the printed circuit board to provide a means of dissipating the large quantity of heat generated by the power transistors.

In heat dissipation techniques of prior art, the printed circuit board is adhesively bonded to a metal heat sink plate. The heat sink plate generally has high thermal conductivity and is the primary thermal radiator to the ambient environment. To effectively transfer the heat from electronic components mounted on the printed circuit board to the heat sink plate, the total thermal resistance between the electronic components and the heat sink plate must be minimized. The adhesive bonding layer is typically an organic polymer that provides the primary attachment of the printed circuit board to the heat sink. It is common practice to place an array of vias below the electronic components in an attempt to increase heat dissipation from the components. However, the adhesive bonding layer accounts for the majority of the thermal resistance between the electronic components and the heat sink.

Often, electronic modules are required to function in a high ambient temperature environment. In this environment large amounts of power must be dissipated by the electronic devices within the electronic module. The commonly available adhesive bonding materials, such as filled organic polymers and the like, have a thermal resistance that is too large to dissipate a sufficient quantity of heat to prevent excessive device temperatures during operation of the electronic modules. Accordingly, further development of thermal attachment mechanisms are necessary to improve the temperature control of electronic modules containing heat-generating electronic components.

Figure 1:
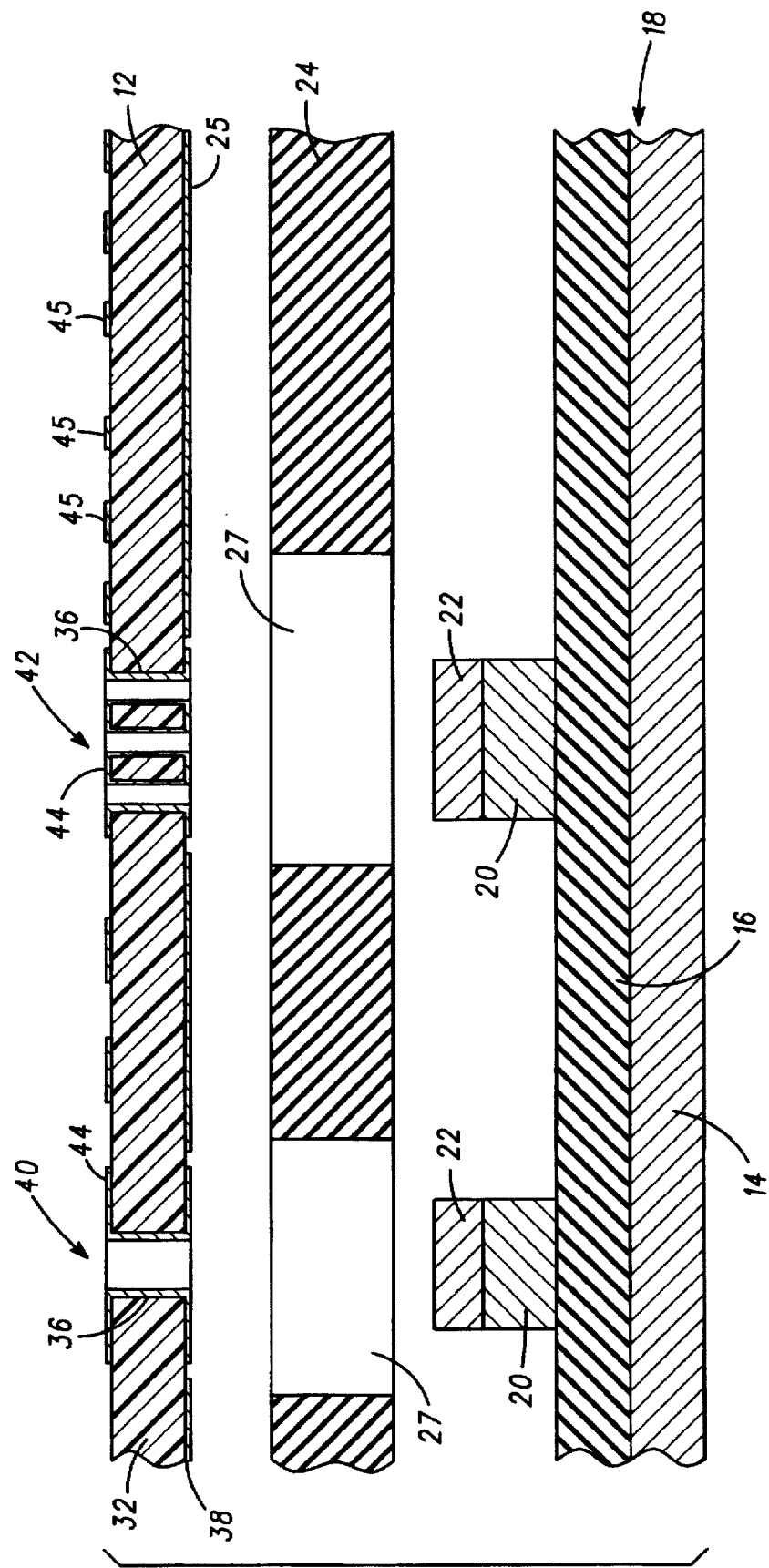
FIG. 1 illustrates, in cross-section, an exploded assembly view of a circuit substrate and a mounting plate attachment in accordance with the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention is for an electronic module in which a circuit substrate is thermally coupled with a mounting plate by the solder attachment of a plurality of thermal vias in the circuit substrate to electrically-isolated, thermal attachment pads on the mounting plate. During operation of the electronic module, thermal emissions from heat-generating electronic components, such as power transistors and the like, are dissipated through the thermal vias to the mounting plate. The thermal vias in the circuit substrate underlie the heat-generating components and terminate at the upper and lower surfaces of the circuit substrate. The thermal vias can be a singular structure or grouped into an array of vias. A plating layer traverses each thermal via and overlies a portion of the upper and lower surface of the circuit substrate around the via. Thermal attachment pads on the mounting plate are positioned to correspond with the locations of the thermal vias in the circuit substrate and are soldered to the plating layer on the lower surface of the circuit substrate. The electronic module of the invention efficiently dissipates the heat generated by the electronic components mounted on the circuit substrate to the surrounding ambient.

An exploded assembly view is shown in FIG. 1 illustrating the method of attachment of a circuit substrate 12 to a mounting plate 18 in accordance with the invention. Mounting plate 18 includes an electrically insulating layer 16 overlying a metal baseplate 14. Circuit substrate 12 is attached to thermal attachment pads 20 positioned on electrically insulating layer 16 by a solder layer 22. Preferably, circuit substrate 12 is fabricated from a conventional insulating material commonly used for printed circuit boards, such as "FR4," polyimide materials, and combinations thereof. Additionally, circuit substrate 12 can be a multi-layer printed circuit board fabricated by laminating successive layers of green sheet material.

Metal baseplate 14 is preferably a heat dissipating metal, such as aluminum, copper, and the like. Electrically insulating layer 16 is preferably a thermally-conductive, electrically-insulating material, such as that used in dielectric-covered, metal mounting plates sold under the tradename "THERMAL CLAD" and available from The Bergquist Company of Minneapolis, Minn. Alternatively, mounting plate 18 can be formed by thermally depositing alumina and a solderable metal onto metal baseplate 14. Thermal deposition processes include thermal spraying, such as flame spraying and the like, and vacuum deposition, such as sputtering and the like.

Thermal attachment pads 20 include a solderable metal layer overlying electrically insulating layer 16. The solderable metal layer can be any metal or combination of metals having a solderable surface, such as gold, copper, and the like. In addition, the solderable metal layer can be composite including an oxidizing metal having a solderable metal coating. For example can be any metal having a tin flashing or a tin/lead solder coating.

It is important to note that thermal attachment pads 20 provide both a thermal pathway for the dissipation of heat from circuit substrate 12 to metal baseplate 14, and also a means of attaching circuit substrate 12 to mounting plate 18. Although the thermal attachment pads reside on electrically insulating layer 16, the overall thermal resistance between devices mounted to circuit substrate 12 is much less than in adhesively bonded structures of the prior art. This is because the thickness of insulating layer 16 is much less than the thickness of adhesives used in the prior art to attach printed circuit boards to metal heat sink plates.

Thermal attachment pads 20 are positioned on electrically insulating layer 16 such that they align with a plurality of thermal vias 36 formed in circuit substrate 12. Thermal vias 36 can be either a single via extending from an upper device surface 32 to a lower mounting surface 38, as shown at 40, or thermal vias 36 can be a plurality of smaller vias each extending from device surface 32 to mounting surface 38, as shown at 42. The plurality of vias can be grouped into a regular array and positioned at various locations in circuit substrate 12. For example, to increase the mechanical strength of the substrate attachment, the via arrays can be located near the corners of the circuit substrate. Where enhanced mechanical strength is necessary, the plurality of thermal vias can be placed independently of the location of electronic components. Furthermore, to improve thermal dissipation, the via arrays can be positioned near the center of circuit substrate 12.

Regardless of the specific configuration, each thermal via includes a plating layer 44 overlying the inner surface of an opening 46 formed in circuit substrate 12. Plating layer 44 overlies a portion of upper device surface 32 and lower mounting surface 38 of circuit substrate 12 in proximity to opening 46. The alignment of thermal attachment pads 20 with thermal vias 36 effectively transfers heat generated by electronic components on device surface 32 of circuit substrate 12 to mounting plate 14.

A plurality of interconnect lands 45 overlie an upper device surface 32 of circuit substrate 12. The lands are connected to a pattern of interconnect traces (not shown) also overlying device surface 32. The interconnect traces electrically couple electronic devices to be mounted on circuit substrate 12. A solder mask 25 is formed on a lower mounting surface 38 of circuit substrate 12. Solder mask 25 is a discontinuous layer over mounting surface 38 and contains openings around the plating layer of each thermal via to permit the attachment of thermal vias 36 to thermal attachment pads 20.

In an optional embodiment, an adhesive layer 24 is placed onto electrically insulating layer 16. Adhesive layer 24 contains openings 27, which permit thermal attachment pads 20 to contact thermal vias 36. Adhesive layer 24 is provided to temporarily attach circuit substrate 12 to mounting plate 18 and attached to solder mask 25 on mounting surface 38. Adhesive layer 24 can be a pressure sensitive adhesive such as a die-cut polymer sheet, a screen printed adhesive, or a deposited adhesive, such as epoxy, acrylic resin, silicone, and the like. As will be subsequently described, the pressure sensitive adhesive provides a temporary attachment prior to heating solder layers 22 to form a metallurgical bond to plating layers 44 underlying circuit substrate 12.

Figure 2:
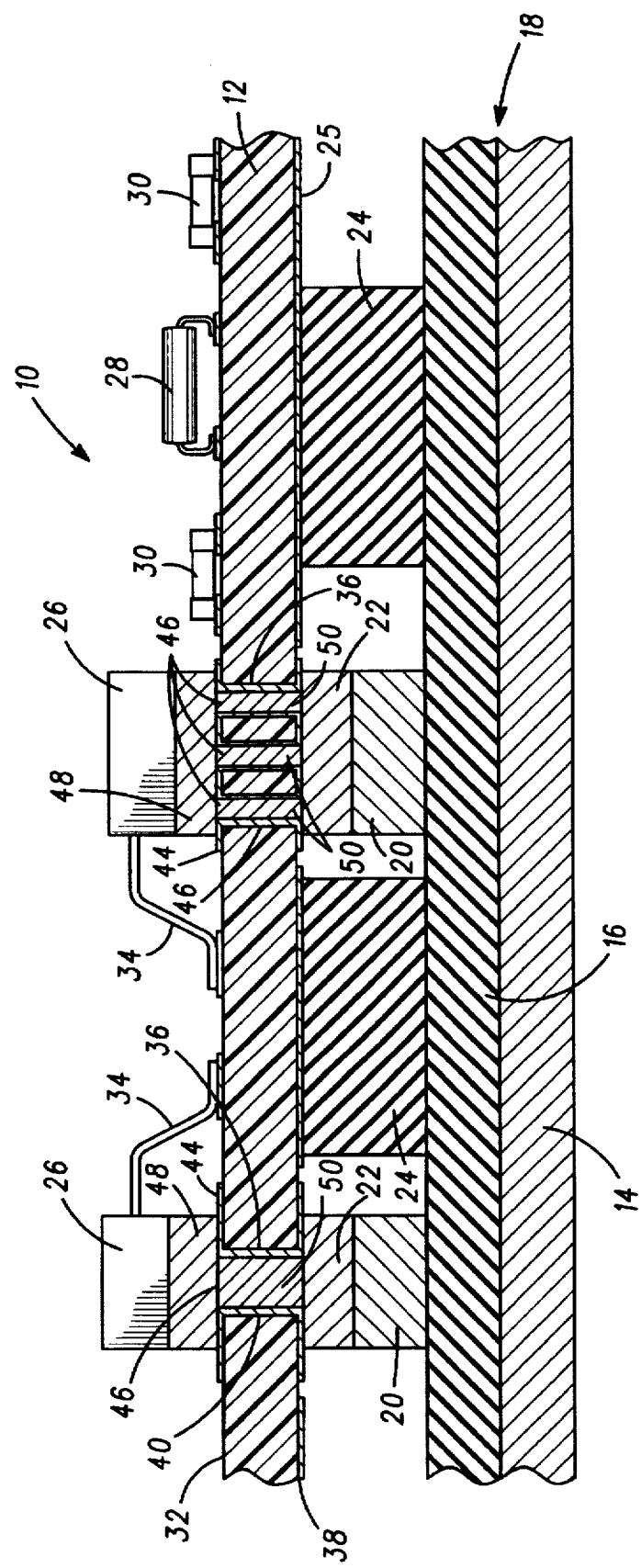
FIG. 2 illustrates, in cross-section, an assembled electronic module arranged in accordance with the invention.

A cross-sectional view of an electronic module 10 assembled in accordance with one embodiment of the invention is shown in FIG. 2. Circuit substrate 12 is populated with a plurality of heat-generating electronic components 26 and a plurality of control devices 28 and 30. Typically, an electronic module requiring the heat dissipation characteristics of the invention contains numerous power transistors, each capable of generating large quantities of heat in normal operation. Control devices 28 and 30 are electrically coupled to the power transistors by interconnect traces (not shown) on device surface 32 of circuit substrate 12.

Heat-generating electronic components 26 are electrically connected to the interconnect traces by package leads 34. Each heat-generating electronic component 26, is attached to a thermal via 36 located in circuit substrate 12. In one embodiment of the invention, electronic components 26 are power transistors, such as a TO-220 power transistors. However, electronic components 26 can be output driver circuits, such as output transistors of an intelligent circuit, sense resistors, a linear driver coupled to an operational amplifier, or any type of heat generating circuit having electrically coupled electronic components, and the like.

A second solder layer 48 attaches heat-generating electronic components 26 to portions of plating layer 44 overlying mounting surface 38. The attachment forms a mechanical, a thermal, and an electrical connection between electronic components 26 and plating layer 44 of the thermal vias 36. Those skilled in the art will recognize that the thermal vias can also be part of a secondary electrical circuit and provide ground connections and the like for the electronic components. Furthermore, thermal attachment pads 20 can be interconnected to provide an electrical pathway between the thermal vias. In an alternative embodiment, the thermal vias can be filled with filler material 50 to increase thermal conductively.

In operation, control devices 28 activate electronic devices 26 causing the electronic devices to generate large quantities of heat. For example, where electronic module 10 is a component of an automotive ignition coil system, electronic devices 26 operate as ignition coil driver devices. The driver devices are activated by signals from control devices 28 and 30. When the coil drivers are activated, the heat generated from the drivers is dissipated by sequentially transferring the heat through second solder layer 48, thermal vias 36, solder layer 22, thermal attachment pad 20, and finally to metal baseplate 14 through electrically insulating layer 16.

It is important to note that the metallurgical solder bond connecting circuit substrate 12 to mounting plate 18 provides much lower thermal resistance than conventional adhesive bonding techniques. The prior art method of using a filled adhesive to attach a printed circuit board carrying TO-220 power transistors to a heat dissipation surface results in a thermal resistance of about 2.75° to 3.75° C. per watt. In contrast, TO-220 populated printed circuit boards of the present invention, using either a thermal sprayed mounting plate or a Bergquist "THERMAL CLAD" mounting plate, provide a thermal resistance of about 0.4° to 0.8° C. per watt. The enhanced heat transfer capability provided by the present invention is effective at controlling the temperature rise of power transistors and other heat-generating electronic devices mounted to a printed circuit board. The temperature rise of the TO-220 devices is directly proportional to the thermal resistance provided by board attachment configuration of the invention.

Further advantages of the present invention can be more fully understood following a description of a representative fabrication process for the assembly of electronic module 10. The fabrication process begins by forming electrically insulating layer 16 on the upper surface of metal baseplate 14. Electrically insulating layer 16 can be a thermally sprayed ceramic material, an anodization layer, a thermally-conductive filled polymer, and the like.

Once electrically insulating layer 16 is in place, thermal attachment pads 20 are formed at selected locations on the surface of electrically insulating layer 16. In preparation of mounting plate 18, a metal foil is laminated to insulating layer 16. The foil is then masked and an etching process is carried out to remove portions of the metal foil and to leave unetched areas of metal. The unetched areas constitute the plurality of thermal attachment pads of the invention. Alternatively, thermal attachment pads 20 can be formed by selectively depositing metal at nucleation sites previously defined at the surface of electrically insulating layer 16. In yet another alternative, a selective deposition process can be used to plate a metal layer in predetermined regions using specifically defined nucleation regions similar to the selective deposition process.

Next, a solder paste is applied to the thermal attachment pads 20 and the circuit substrate is mounted to the mounting plate by aligning the thermal vias 36 to the solder covered thermal attachment pads 20. Then, solder paste is applied to device surface 32 of circuit substrate 12 and the electronic components are placed on device surface 32. After applying solder paste, the entire assembly is subjected to a solder reflow operation, such that the electronic devices are soldered to device surface 32 simultaneously with the permanent attachment of circuit substrate 12 to thermal attachment pads 20. Thus, in a single process step electronic components 26 are attached to circuit substrate 12 and the circuit substrate itself is attached to mounting plate 14.

As previously described, in an optional process method, to prevent slippage of circuit substrate 12 during the solder reflow operation, adhesive layer 24 is placed on the surface of electrically insulating layer 16. The pressure sensitive adhesive temporarily holds circuit substrate 12 in place until metallurgical solder bonds are formed by solder layer 22.

Thus it is apparent that there has been provided, in accordance with the invention, a solder bonded electronic module that fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, many different kinds of heat-generating electronic components can be mounted to the circuit substrate, such as D-PACK, D2-PACK, HSOP packaged devices, and the like, or any similar device with exposed, solderable thermal tab on the lower surface. It is therefore intended to include within the invention all such variations and modifications as fall within the scope of the appended claims and equivalents thereof.

We claim:

1. An electronic module comprising:
   a circuit substrate having a thermal via disposed therethrough;
   a heat-generating electronic component overlying an upper surface of the thermal via;
   a metal baseplate;
   an electrically insulating layer overlying the metal baseplate;
   a thermal attachment pad overlying the electrically insulating layer; and
   a solder layer overlying the thermal attachment pad, wherein the solder layer thermally couples the thermal via to the thermal attachment pad and attaches the circuit substrate to the metal plate.

2. The electronic module of claim 1, wherein the thermal via comprises:
   an opening in the circuit substrate, the opening having an inner surface extending from an upper surface of the circuit substrate to a lower surface of the circuit substrate; and
   a metal plating layer overlying the inner surface and a portion of the upper and lower surfaces of the circuit substrate in proximity to the opening.

3. The electronic module of claim 2 further comprising:
   a solder mask overlying the portions of lower surface of the circuit substrate; and
   an adhesive layer overlying the electrically insulating layer at positions intermediate to portions of the solder mask and the electrically insulating layer.

4. The electronic module of claim 1 further comprising:
   an interconnect trace disposed on the circuit substrate; and
   a control circuit electrically coupled to the heat-generating electronic component by the interconnect trace,
   wherein, the control circuit activates the heat-generating electronic component causing a thermal emission from the heat-generating electronic component that is dissipated through the thermal via to the mounting plate.

5. An electronic module comprising:
   a printed circuit board populated with a plurality of heat-generating electronic components,
   wherein each heat-generating electronic component overlies a plurality of thermal vias extending through the printed circuit board;
   a mounting plate including a metal baseplate having an electrically insulating layer thereon; and
   a plurality of thermal attachment pads at selected locations on the electrically insulating layer thermally coupling the plurality of heat-generating electronic components to the mounting plate,
   wherein each of the plurality of thermal attachment pads is bonded to the plurality of thermal vias by a solder layer, and
   wherein the plurality of thermal attachment pads attach the printed circuit board to the mounting plate.

6. The electronic module of claim 5 further comprising:
   a control circuit electrically coupled to the plurality of heat-generating electronic components,
   wherein the control circuit activates the plurality of heat-generating electronic components, and
   wherein heat from the plurality of heat-generating electronic components is transferred to the mounting plate through the plurality of thermal vias.

7. The electronic module of claim 5, wherein each thermal via comprises an opening in the circuit substrate, the opening having an inner surface extending from an upper surface of the circuit substrate to a lower surface of the circuit substrate, and a metal plating layer overlying the inner surface and a portion of the upper and lower surfaces of the circuit substrate in proximity to the opening, and wherein each of the plurality of power transistors is bonded to the plating layer.

8. An electronic module comprising:
   a multi-layer printed circuit board having a device surface opposite a mounting surface;
   a plated via extending through the multi-layer printed circuit board from the device surface to the mounting surface;

a heat-generating electronic component attached to the plated via;

an aluminum mounting plate having a thermally conductive, electrically insulating material thereon;

a solderable metal layer overlying the thermally conductive, electrically insulating material; and a solder layer overlying the solderable metal layer, wherein the solder layer thermally couples the plated via to the copper layer, and wherein the solder layer attaches the multi-layer printed circuit board to the aluminum mounting plate.

9. The electronic module of claim 8 further comprising:

a control circuit disposed on the device surface of the multi-layer printed circuit board and electrically coupled to the heat-generating electronic component, wherein the control circuit activates the heat-generating electronic component, and wherein heat from the heat-generating electronic component is transferred to the aluminum mounting plate through the plated via and through the thermally conductive, electrically insulating material.

10. The electronic module of claim 8, wherein the electronic module contains a plurality of plated vias, and wherein the solderable metal layer is configured as a plurality of copper pads residing on the thermally conductive, electrically insulating material at locations corresponding to the plurality of plated vias.

11. The electronic module of claim 10, wherein each of the plurality of plated vias comprise:

an opening in the multi-layer printed circuit board, the opening having an inner surface extending from the device surface to the mounting surface; and a metal plating layer overlying the inner surface and a portion of the device surface and a portion of the mounting surface in proximity to the opening.

* * * * *

UNITED STATES PATENT AND TRADEMARK OFFICE
CERTIFICATE OF CORRECTION

PATENT NO. : 5,708,566
DATED : January 13, 1998
INVENTOR(S) : Hunninghaus, et al.

It is certified that error appears in the above-indentified patent and that said Letters Patent is hereby corrected as shown below:

Column 7, line 10 reads "via to the copper layer, and" should be -- via to the solderable metal layer, and--.

Signed and Sealed this

Twenty-second Day of September, 1998

Attest:

BRUCE LEHMAN

*Attesting Officer*       *Commissioner of Patents and Trademarks*